US009899343B2

United States Patent
West et al.

(10) Patent No.: US 9,899,343 B2
(45) Date of Patent: Feb. 20, 2018

(54) HIGH VOLTAGE TOLERANT BONDING PAD STRUCTURE FOR TRENCH-BASED SEMICONDUCTOR DEVICES

(71) Applicants: Polar Semiconductor, LLC, Bloomington, MN (US); SANKEN ELECTRIC CO., LTD., Saitama (JP)

(72) Inventors: Peter West, Minneapolis, MN (US); Steven Kosier, Lakeville, MN (US); Tatsuya Kamimura, St. Louis Park, MN (US); Don Rankila, Farmington, MN (US)

(73) Assignees: Polar Semiconductor, LLC, Bloomington, MN (US); SANKEN ELECTRIC CO., LTD., Saitama (JP)

( * ) Notice: Subject to any disclaimer, the term of this patent is extended or adjusted under 35 U.S.C. 154(b) by 0 days.

(21) Appl. No.: 15/065,227

(22) Filed: Mar. 9, 2016

(65) Prior Publication Data

US 2017/0263580 A1    Sep. 14, 2017

(51) Int. Cl.
| | |
|---|---|
| *H01L 23/00* | (2006.01) |
| *H01L 29/423* | (2006.01) |
| *H01L 29/66* | (2006.01) |
| *H01L 29/78* | (2006.01) |
| *H01L 23/498* | (2006.01) |
| *H01L 21/768* | (2006.01) |
| *H01L 29/739* | (2006.01) |

(52) U.S. Cl.
CPC ........ *H01L 24/06* (2013.01); *H01L 21/76802* (2013.01); *H01L 21/76877* (2013.01); *H01L 23/49811* (2013.01); *H01L 23/49844* (2013.01); *H01L 29/4236* (2013.01); *H01L 29/66666* (2013.01); *H01L 29/7395* (2013.01); *H01L 29/7827* (2013.01); *H01L 2224/04042* (2013.01)

(58) Field of Classification Search
CPC .......................... H01L 24/06; H01L 21/76802
See application file for complete search history.

(56) References Cited

U.S. PATENT DOCUMENTS

| | | | |
|---|---|---|---|
| 8,963,212 B2 | 2/2015 | Yedinak et al. | |
| 2011/0121386 A1* | 5/2011 | Hsieh | H01L 27/11519 257/334 |
| 2012/0273871 A1* | 11/2012 | Yedinak | H01L 29/872 257/329 |

* cited by examiner

*Primary Examiner* — Errol Fernandes
(74) *Attorney, Agent, or Firm* — Kinney & Lange, P.A.

(57) ABSTRACT

Apparatus and associated methods relate to a bonding pad structure for a trench-based semiconductor device. The bonding pad structure reduces a peak magnitude of the electric field between a metal bonding pad and the underlying semiconductor. The bonding pad structure includes a plurality of trenches vertically extending from a top surface of a semiconductor. Each of the plurality of trenches has dielectric sidewalls and a dielectric bottom, the dielectric sidewalls and dielectric bottom electrically isolating a conductive core within each of the trenches from a region of semiconductor outside of and adjacent to each of the plurality of trenches. The bonding pad structure includes a metal bonding pad disposed above the plurality of trenches, the metal bonding pad electrically isolated from the region of semiconductor outside of the trenches. The conductive core can be biased to reduce the magnitude of the field between adjacent trenches.

21 Claims, 9 Drawing Sheets

HIGH VOLTAGE TOLERANT BONDING PAD STRUCTURE FOR TRENCH-BASED SEMICONDUCTOR DEVICES

BACKGROUND

Power MOSFETS are a type of Metal Oxide Semiconductor Field Effect Transistor (MOSFET) that are designed to handle significant power levels. Some of these devices are designed to switch high currents and thus can have low on resistance. Some of these devices are designed to tolerate high voltages across the device's terminals. The voltage tolerance and current requirements have resulted in device configurations different from tradition MOSFET designs. One such device configuration involves trenches, which have been used to provide vertical channel conduction for such power MOSFETS. Orienting these MOSFETS vertically has improved the layout efficiency of such devices.

Bonding pads are used to facilitate electrical connection between a semiconductor device and other circuit components. Bonding pads provide a large surface areas of a metal to which a wire can be bonded. Wire bonding machines can bond wires between leads of a package and bonding pads of a semiconductor chip. These wire bonds provide electrical communication between the semiconductor chip and the package leads. In some embodiments solder bumps are formed on the bonding pads. The solder bumped chip can then be flipped and aligned onto a circuit board that has pads that are complementary to and align with the bumped pads of the flipped semiconductor chip. After aligning the flipped semiconductor chip with the complementary pads of the circuit board, the solder can be heated so as to make it to reflow. After reflow of the solder bumps, the solder bumps provide electrical connectivity between the bonding pads of the semiconductor chip and the complementary pads of the circuit board.

Because bonding pads occupy large surface areas of the chip, they can present large parasitic capacitances between the metal of the bonding pad and a top surface of the semiconductor directly beneath the bonding pads. Large parasitic capacitances can capacitively communicate large voltage transients between the bonding pads and the top surface of the semiconductor. Capacitive communication between a bonding pad and the top surface of the semiconductor can be further facilitated by large voltage transients on either or both plates of such parasitic capacitors. Switching high voltages can produce such large voltage transients.

SUMMARY

Apparatus and associated methods relate to a bonding pad structure for a trench MOSFET that includes a plurality of trenches vertically extending from a top surface of a semiconductor. Each of the plurality of trenches has dielectric sidewalls and a dielectric bottom. The dielectric sidewalls and dielectric bottom electrically isolate a conductive core within each of the trenches from a drain-biased region of the semiconductor outside of and adjacent to each of the plurality of trenches. The bonding pad structure includes a metal bonding pad disposed above the plurality of trenches. The metal bonding pad is electrically isolated from the drain-biased region of semiconductor outside of the trenches.

In some embodiments, the bonding pad structure can have a bonding pad region and a region surrounding the bonding pad region. In some embodiments each of the trenches can be a longitudinal trench. Each longitudinal trench has a longitudinal dimension and a lateral dimension. The longitudinal dimension is measured from a first longitudinal sidewall to a second longitudinal sidewall. The longitudinal dimension can be at least four times greater than the lateral dimension. In some embodiments, the longitudinal dimension can be at least ten times greater than the lateral dimension. The lateral dimension is measured from a first lateral sidewall to a second lateral sidewall. The bonding pad structure can include a layer of interconnect metal disposed above the plurality of longitudinal trenches in the region surrounding the bonding pad region. The layer of interconnect contacts each of the plurality of conductive cores so as to facilitate biasing of the plurality of the conductive cores. The layer of interconnect electrically connects each of the conductive cores to one another, such that the plurality of conductive cores are commonly biased.

An exemplary method of manufacturing a semiconductor device includes etching a plurality of trenches into a semiconductor. Each of the plurality of trenches extends from a top surface of the semiconductor. Each of the plurality of trenches having sidewalls and a bottom. The method includes lining the sidewalls and the bottom of each of the plurality of trenches with a first dielectric material. The dielectric material isolates an interior cavity from the semiconductor. The method includes depositing a conductive material into each of the interior cavity of each of the plurality of trenches. The method includes providing a second dielectric material within the interior cavity of each of the plurality of trenches. The method includes etching the second dielectric material to expose the conductive material. The method includes depositing a first layer of metal that electrically contacts the conductive material within each of the cavities. The method includes patterning the first layer metal into a plurality of interconnection nets. The method also includes disposing a bonding pad above a portion of the plurality of trenches. The bonding pad is electrically isolated from both a drain-biased region of semiconductor outside of the trenches and conductive material within the portion of the plurality of trenches.

DETAILED DESCRIPTION

Figure 1:
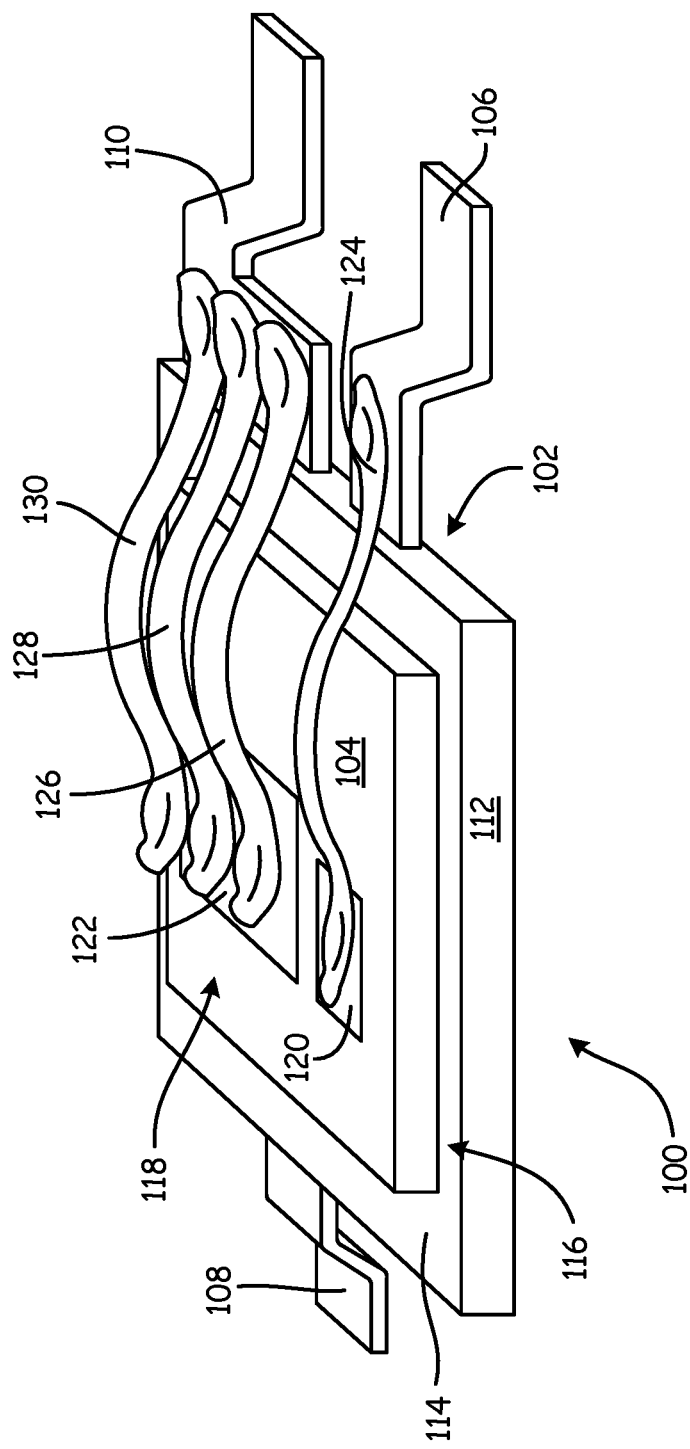
FIG. 1 is a perspective view of an exemplary trench-MOSFET die wire bonded to a package.

FIG. 1 is a perspective view of an exemplary trench-MOSFET die wire bonded to a package. In FIG. 1, exemplary power transistor 100 includes package 102 and die 104. Package 102 includes leads 106, 108, 110 and substrate 112. Conductive layer 114 has been formed on substrate 112. Die 104 has bottom surface 116 and top surface 118. Bonding pads 120, 122 are formed on top surface 118. Bonding pads 120, 122 are electrically connected to leads 106, 110, respectively, via bonding wires 124, 126, 128, 130. Die 104 is electrically and mechanically connected to package 102 at bottom surface 116. Bottom surface 116 is connected to package 102 via conductive layer 114. Conductive layer 114 is electrically connected to lead 108. Thus, bottom surface 116 of die 104 is in electrical communication with lead 108. Leads 106, 110 are similarly in electrical communication with bonding pads 120, 122, respectively.

In the depicted embodiment, die 104 has been mounted in package 102 to facilitate electrical connection between die 104 and a circuit or system. In the depiction, die 104 is a trench MOSFET. Hereafter, trench MOSFET 104 will be used synonymously with die 104. Trench MOSFET 104 has a gate, a source and a drain. The gate of trench MOSFET 104 is electrically connected to bonding pad 120. The source of trench MOSFET 104 is electrically connected to bonding pad 122. The drain of trench MOSFET 104 is electrically connected to bottom surface 116. Thus, leads 106, 108, 110 are electrically connected to the gate, drain, and source, respectively, of trench MOSFET 104.

The power transistor 100 depicted in FIG. 1 has a top-side contacted source and drain and a bottom-side contacted drain. Such an arrangement of contacts can be problematic for high-voltage devices. The bulk of die 104 is biased directly or indirectly by bottom-side drain contact. The top-side source and drain contacts are then in close proximity to the underlying drain-biased semiconductor. Providing additional spatial separation between these top-side contacts and the underlying drain-biased region of semiconductor reduces the source and gate capacitive coupling to the drain, as well as reduces the possibility of an undesirable electric breakdown resulting from excessive electric fields in the semiconductor.

In some embodiments, much of the semiconductor device will be drain biased. Drain biased, in this context, means that such drain-biased regions are in electrical communication with the drain in such a way that the voltage in the drain-biased regions varies in response to variations in the drain voltage. No reverse biased p-n junctions separate such drain-biased regions from the drain terminal. In various embodiments, various types of trench-based semiconductor devices can be manufactured. For example, in some embodiments, power transistor 100 can be a trench MOSFET. In an exemplary embodiment, power transistor 100 can be a trench IGBT. In some embodiments, instead of power transistor 100, the semiconductor die can be trench diode 100, for example.

For any type of power device manufactured on the semiconductor die, one or more terminal can be biased to a high magnitude voltage with respect to other terminals. The high-voltage-biased terminal can be manufactured as a bottom-side contact. In this way, the high-voltage-biased terminal is physically located distal to all top-side terminals. In some embodiments, a bottom-side contact can be a drain contact. In some embodiments a bottom side contact can be a collector contact. In an exemplary embodiment a bottom side contact can be an anode or cathode contact, for example. Thus, for non-MOSFET devices, the drain-biased region might instead be a collector-biased region, or a cathode-biased region, or more generally a region biased by the bottom-side contact.

Figure 2:
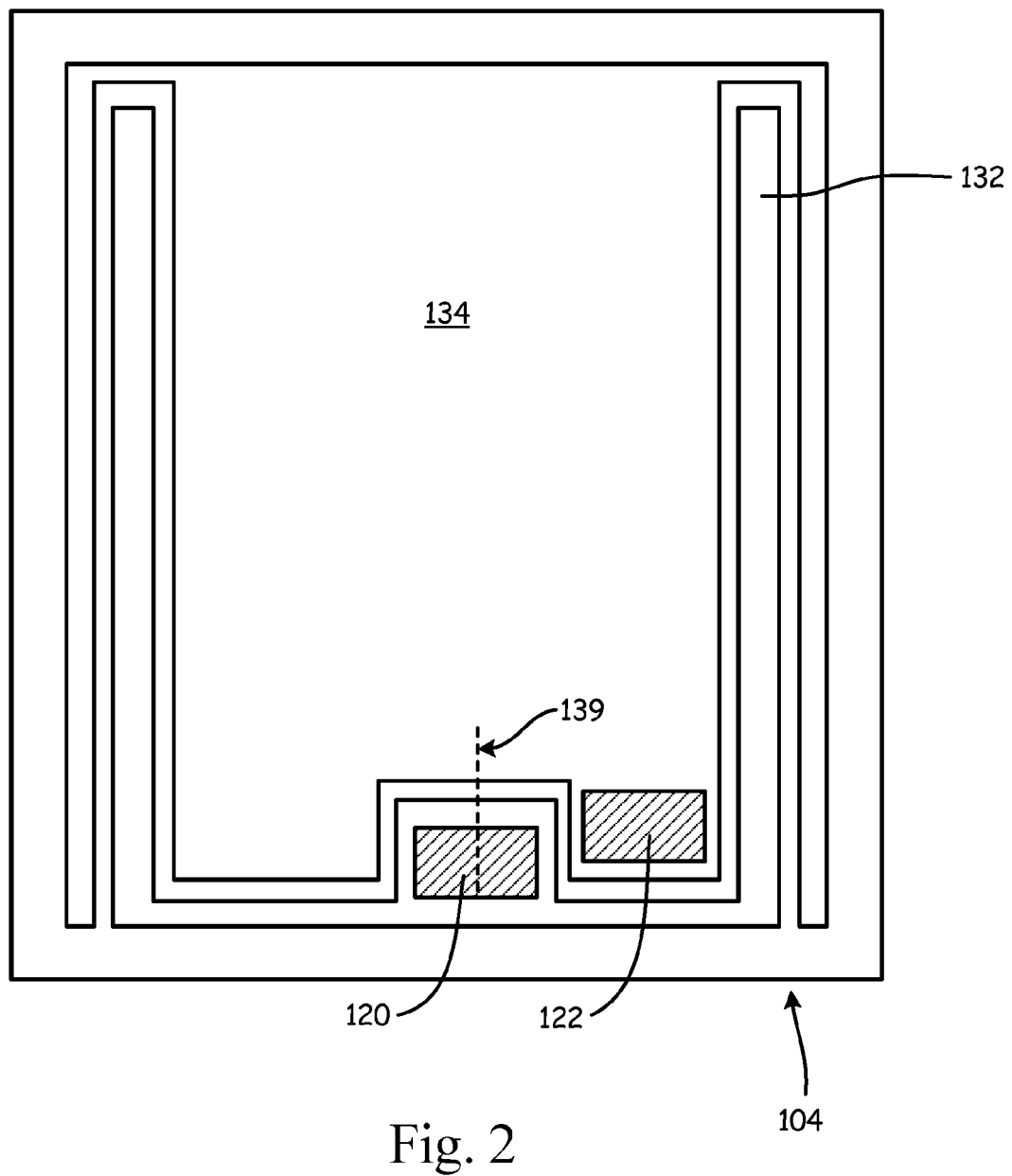
FIG. 2 is a plan view of an exemplary trench-MOSFET die showing a top metal layer and a bonding pad arrangement.

FIG. 2 is a plan view of an exemplary trench-MOSFET die showing a top metal layer and a bonding pad arrangement. In FIG. 2, trench-MOSFET die 104 is shown with metallization features 132, 134, and bonding pads 120, 122. Interconnect metallization features 132, 134 can be patterned from a layer of interconnect metal, for example. Bonding pad 120 is a region where a top dielectric has been removed to expose underlying metal from metallization feature 132. Bonding pad 122 is a region where a top dielectric has been removed to expose underlying metal from metallization feature 134. Bonding pads 120, 122 define the regions where bonding wires 124, 126, 128, 130 can make electrical connection with trench-MOSFET die 104. Metallization feature 132 provides electrical communication between bonding pad 120 and the gate of trench-MOSFET die 104. Metallization feature 134 provides electrical communication between bonding pad 122 and the source of trench-MOSFET die 104.

Metallization feature 132 is U-shaped and is a complementary feature to metallization feature 134, which is M-shaped. Because the source of a MOSFET can carry much more current, at least in a steady-state condition, than the gate of a MOSFET, M-shaped metallization feature 134 covers substantially more surface area than U-shaped metallization feature 132. Because M-shaped metallization feature 134 has so great a surface area, the resistance between bonding pad 122 and the source of trench MOSFET die 104 can be relatively small compared with the resistance between bonding pad 120 and the gate of trench MOSFET die 104.

Top-side bonding pads 120, 122 are located above the underlying drain-biased semiconductor. Such juxtaposition of bonding pads 120, 122 vis-à-vis the underlying drain-biased semiconductor can be made possible for high-voltage devices by interposing structures that increase the separation distance between bonding pads 120, 122 and the drain-biased regions of semiconductor thereunder.

Figure 3:
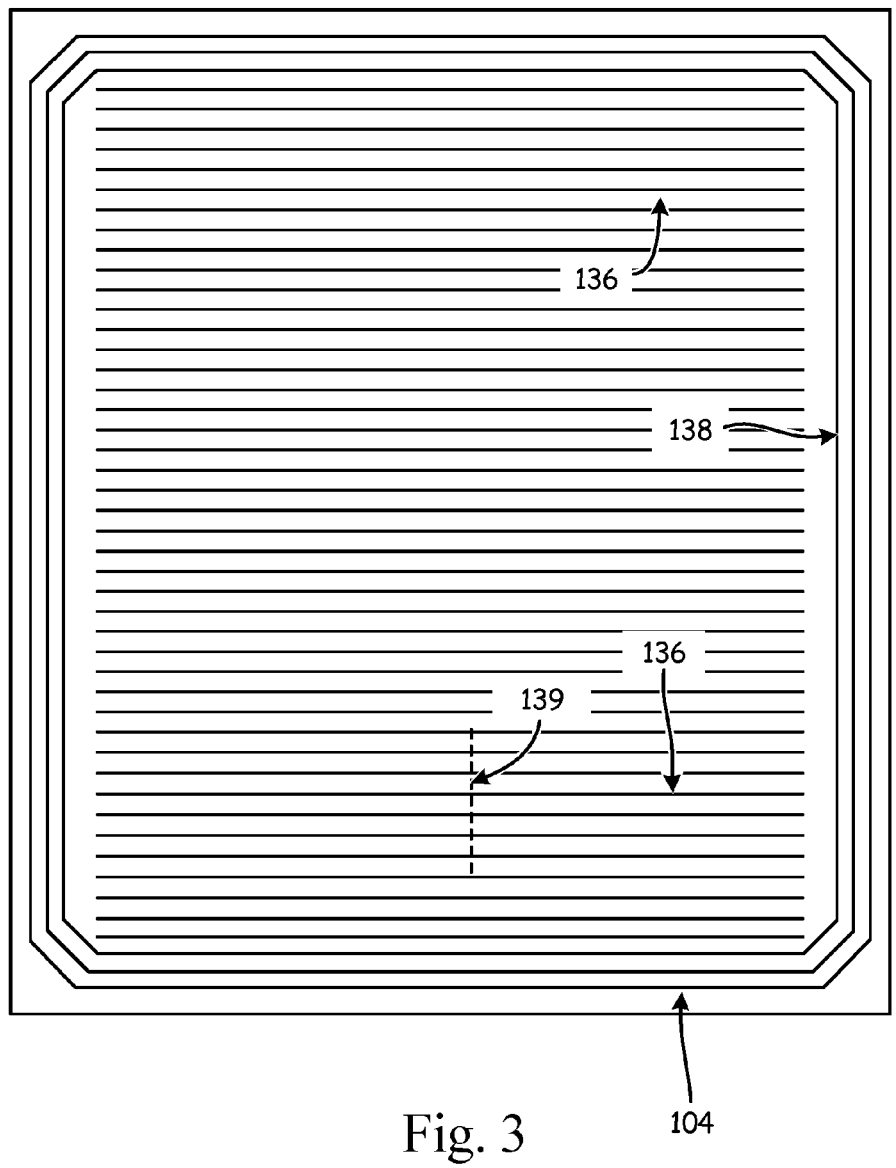
FIG. 3 is a plan view of the exemplary trench-MOSFET die depicted in FIG. 2 showing trenches in the semiconductor beneath the metal layer.

FIG. 3 is a plan view of the exemplary trench-MOSFET die depicted in FIG. 2 showing trenches in the semiconductor beneath the metal layer. In FIG. 3, trench-MOSFET die 104 is shown depicting trenches 136, 138 residing beneath metallization features 132, 134 shown in FIG. 2. Trenches 136 can include portions that have active device components, such as MOSFET gates. Trenches 136 can be located immediately adjacent to semiconductor regions that include active device component regions, such as MOSFET sources, drains, and bodies, in the adjoining semiconductor. Superimposing FIG. 2 on top of FIG. 3 reveals that bonding pads 120, 122 are located above trenches 136. Locating bonding pads above trenches can advantageously reduce the capacitive coupling between the bonding pad and an underlying drain of the trench-MOSFET die 104.

Trenches 138 are termination trench structures. Trenches 138 might not include active device components, and trenches 138 might not border active device component regions in the adjoining semiconductor. Termination trenches 138 are used to reduce the magnitude of an electric field at active device component regions of the trench-MOSFET die 104 near the periphery of the trench-MOSFET die 104. Termination trenches 138 are depicted circumscribing trenches 136.

Trenches 138 are structures that can be used to substantially deplete majority carriers from the surface regions of semiconductor adjacent and between trenches 138. By depleting majority carriers, the conductivity of the semiconductor can be greatly inhibited. Low-conductivity regions of semiconductor can be used to distribute an electric field, thereby minimizing the maximum electric field. Such low-conductivity regions can also be used to increase the dielectric layer thickness between the mobile carrier regions of the bonding pads 120, 122 and the underlying conductivity regions beneath the depleted regions of semiconductor.

Figure 4:
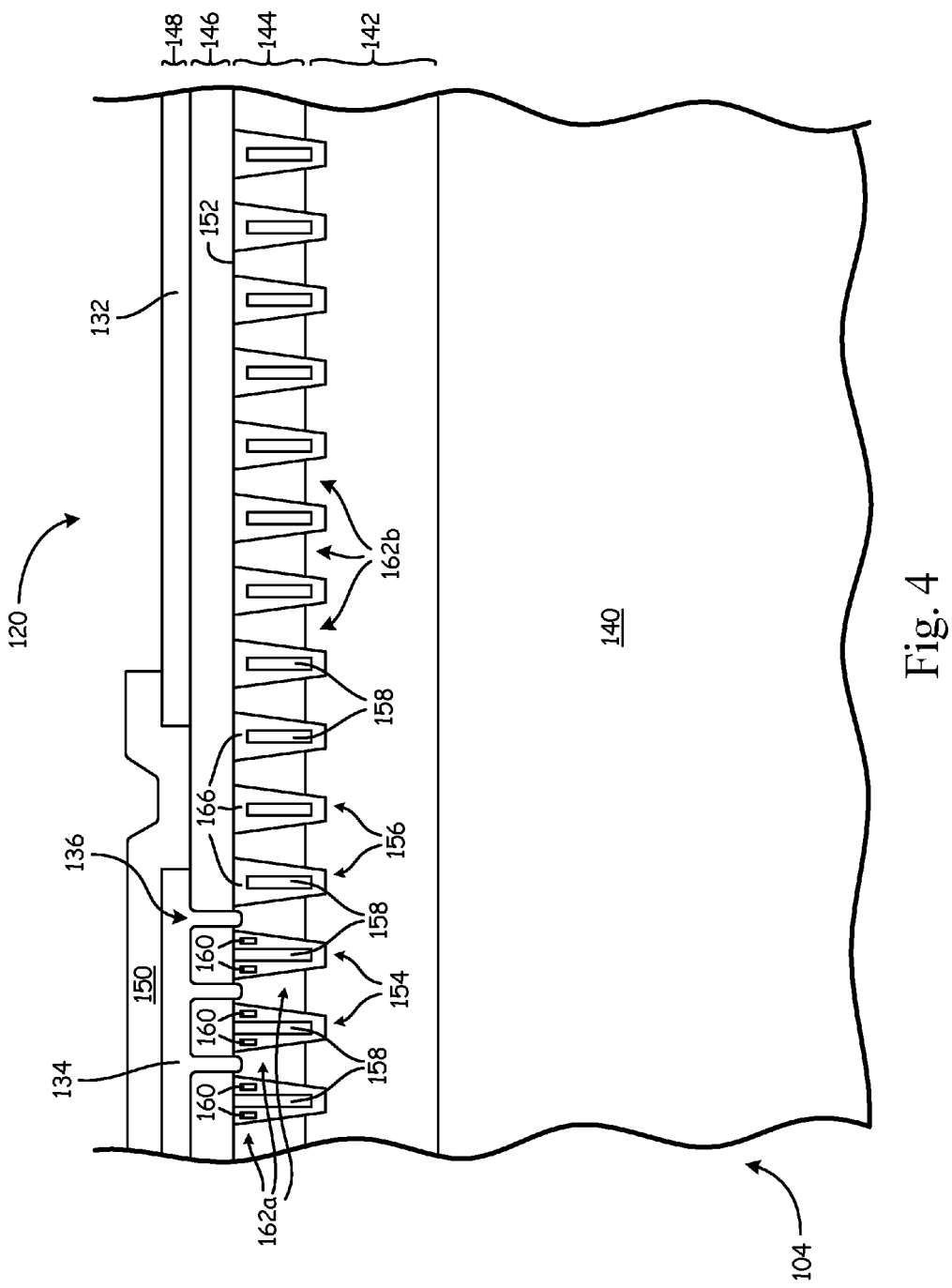
FIG. 4 is a cross-sectional side elevation view of a cross-section of an exemplary trench MOSFET die.

FIG. 4 is a cross-sectional side elevation view of an exemplary trench-MOSFET die. In FIG. 4, trench-MOSFET die 104 is shown in cross-section, the depicted cross section occurring along line segment 139 of FIGS. 2-3. Bonding pad 120 facilitates access for wire bonding to gate metallization feature 132. Source metallization feature 134 is depicted to the left of gate metallization feature 132 in FIG. 4. Trench-MOSFET die 104 includes substrate 140, first epitaxial layer 142, second epitaxial layer 144, dielectric layer 146, metal layer 148, and passivation layer 150. Trench-MOSFET die 104 has semiconductor/dielectric interface 152 between second epitaxial layer 144 and dielectric layer 146. Trenches 154, 156 extend from semiconductor/dielectric interface layer 152, through second epitaxial layer 144, and into first epitaxial layer 142. Active trenches 154 include field gates 158 and device gates 160. Inactive trenches 156 contain field gates 158. Field gates 158 and device gates 160 are isolated from semiconductor regions adjacent to trenches 154, 156 via dielectric 166.

Creation of trenches 154, 156 has defined semiconductor pillars 162a, 162b between each pair of adjacent trenches 154, 156. Various types of semiconductor pillars 162a, 162b are shown in FIG. 4. On the left side of the figure are active device pillars 162a. On the right side of the figure are epitaxial pillars 162b. Epitaxial pillars 162b are located beneath bonding pad 120 and gate metallization feature 132. Each epitaxial pillar 162b presents a junctionless path from top surface 152 to substrate 140. In some embodiments, epitaxial pillars 162b are uncontacted at top surface 152, and therefore have no topside supplied bias condition.

Semiconductor pillars 162a can selectively include active device component regions, such as source, drain, and body regions of a MOSFET. Whether or not a particular one of semiconductor pillars 162a, 162b is processed so as to have active device component regions created therein can depend on whether the adjacent trenches will be processed to include active device gate structures 160 therein. A trench 154 and its adjacent semiconductor pillar(s) 162a, 162b act in concert to function as a MOSFET. A trench MOSFET can be made by creating device gate 160 within trench 154 and also creating source, body, and drain regions in the adjacent ones of semiconductor pillars 162a, 162b. Source, drain, and body regions are not depicted in FIG. 4. The trench MOSFET described here will be more clearly described below, with reference to FIG. 5A.

Because field gates 158 can be biased, pillars 1621, 162b can be substantially depleted of majority carriers between trenches 154, 156. For example, majority carriers might be depleted in pillars 162a, 162b if field plates 158 are grounded and substrate 140 is biased to a high-voltage (e.g., 200 Volts). Substrate 140, first epitaxial layer 142 and second epitaxial layer 144 might all have a net n-type doping concentration. These conditions can result in electrons (i.e., the majority carrier in these n-type layers) being repelled by field plates 158 and attracted to drain-biased substrate 140.

The condition for complete depletion of majority carriers from pillars 162a, 162b is based on various parameters, including: i) net dopant concentrations in the layers 140, 142, 144; ii) bias conditions at substrate 140 and field plates 158, iii) pillar width; and iv) thickness of dielectric within trenches 154, 156. In some embodiments, these parameters will be designed such that a ratio of the lateral dimension of a trench to the lateral pitch between adjacent trenches can be between about 0.4 and 0.6.

Figure 5A:
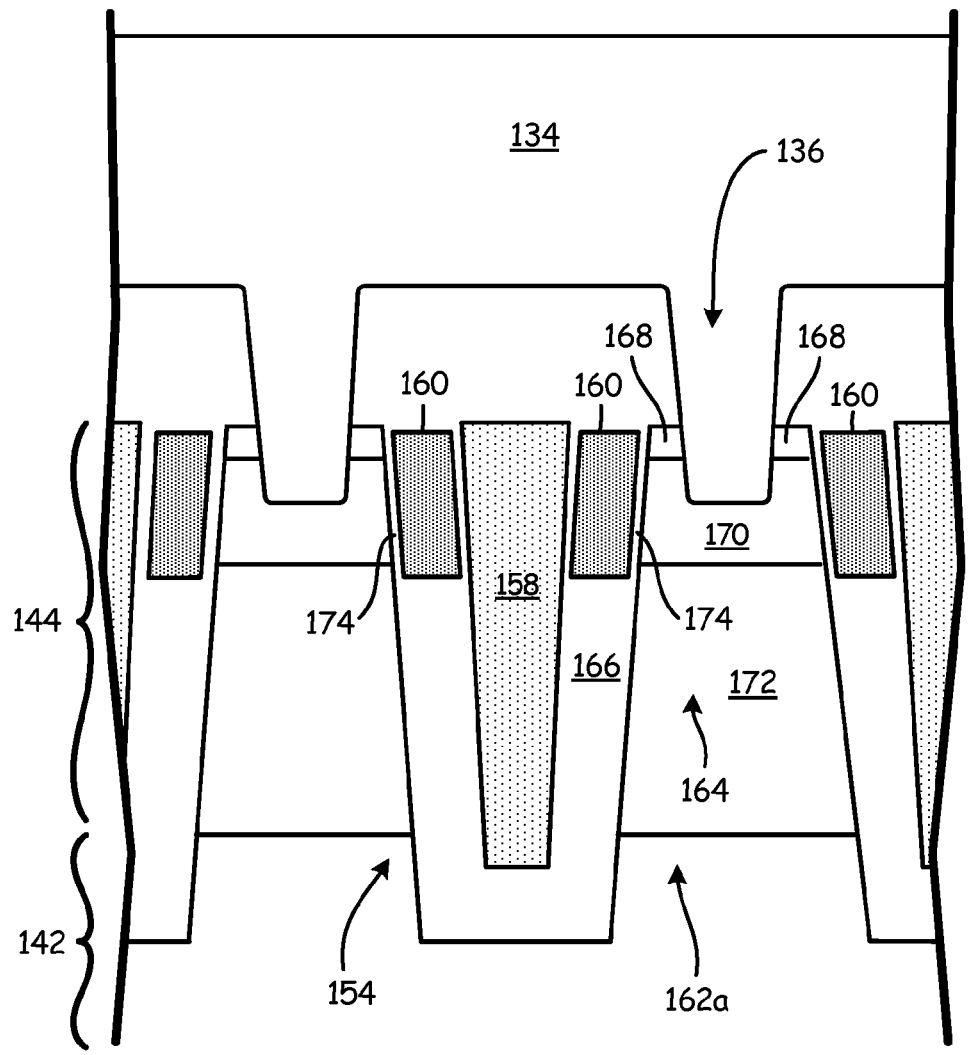
FIGS. 5A-5B are cross-sectional side elevation views of exemplary trench structures.
Figure 5B:
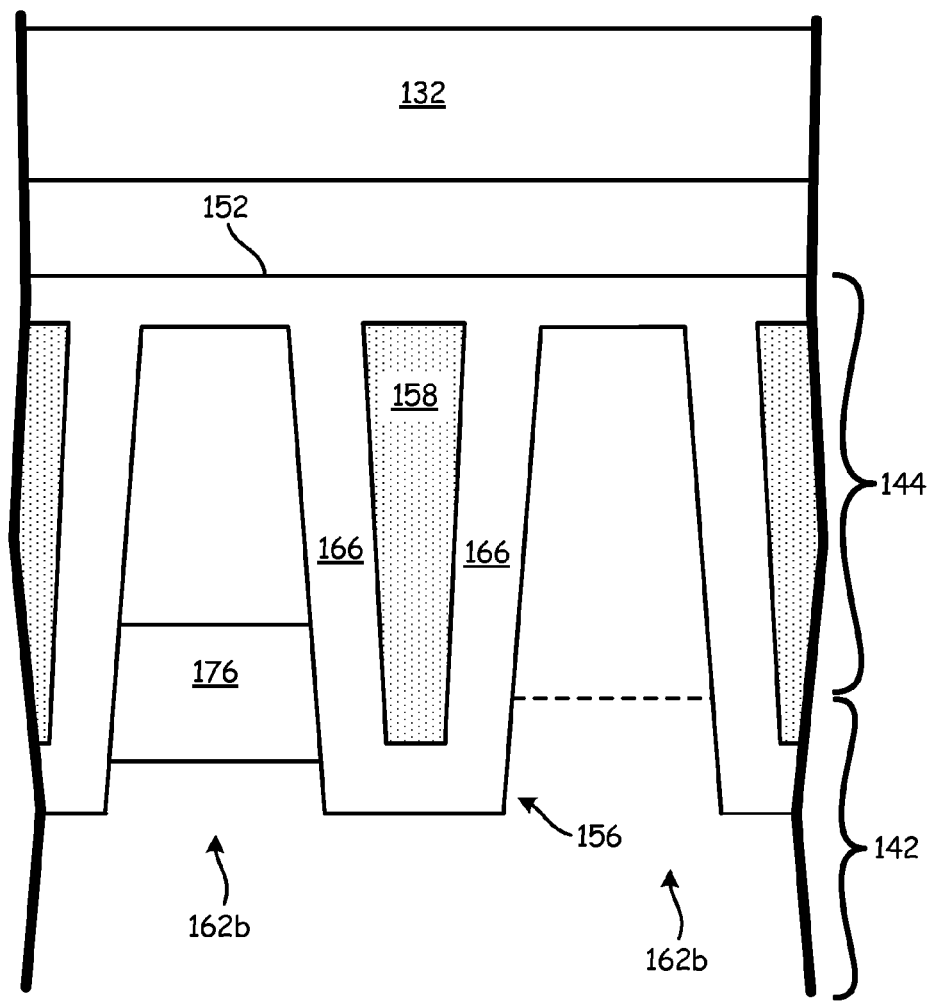

FIGS. 5A-5B are cross-sectional side elevation views of exemplary trench structures. In FIG. 5A, a small portion of the cross section depicted in FIG. 4 is shown, the small portion including trench MOSFET 164. Trench MOSFET 164 includes gate 160, source 168, body 170, and drain 172. Gate 160 is separated from source 168, body 170, and drain 172 by gate dielectric 174. Gate dielectric 174 may be relatively thin so as to facilitate the field effect of gate 160 upon body 170. Gate 160 can be polysilicon, and dielectric 174 can be silicon-dioxide, for examples.

Source 168 and drain 172 can be doped either both n-type or both p-type depending on the desired transistor species. Body 170 will then be doped the type opposite that of source 168 and drain 172, assuming enhancement type operation. Contact 136 provides electrical connection between both source 168 and body 170 and source metallization feature 134. In the depicted embodiment, both source 168 and body 170 are connected with source metallization feature 134 via contact 136. Thus, body 170 will be biased the same as source 172 in this depicted embodiment.

Trench 154 includes device gates 160 on either side of field gate 158. Device gates 160 and field gates 158 are made of conductive materials. For example, device gates 160 and/or field gates 158 can comprise polysilicon. Device gates 160 can be biased to induce a channel in body 170 so as to provide electrical conductivity between source 168 and drain 172. Field gates 158 can be biased such that field gates 158 in adjacent trenches 154 effectively shield intervening semiconductor pillars 162a from excessive voltages. Drain 172 can be biased with a high voltage, for example, via a backside wafer connection. Field gates 158 on either side of semiconductor pillars 162a can effectively shield semiconductor pillars 162a therebetween from voltages that might cause electrical breakdown of trench MOSFET 164 created therein.

Junctionless electrical continuity of the drain 172 is maintained from the metallurgical junction, formed between body 170 and drain 172, through to the backside of the trench-MOSFET die 104. Body 170 is formed within second epitaxial layer 144. Second epitaxial layer 144 can be doped more heavily than first epitaxial layer 142, providing a low on resistance to trench MOSFET 164. Thus, drain 172 has a junctionless electrical conductivity path from second epitaxial layer 144, through first epitaxial layer 142 to substrate 140 (shown in FIG. 4).

In FIG. 5B, trench 156 is shown in detail. Trench 156 has field gate 158 isolated from surrounding semiconductor pillars 162b by dielectric 166. Dielectric 166 surrounds field gate 158 on lateral sides of trench 156 and on bottom of trench 156. Trench 156 extends from semiconductor/dielectric interface 152 through second epitaxial layer 144 and into first epitaxial layer 142. Semiconductor pillar 162b on the left side of depicted trench 156 includes buried layer 176. Buried layer 176 was formed by implanting a dopant species after first epitaxial layer 142 has been grown and before second epitaxial layer 144 has been grown. The implanted dopant species of buried layer 176 can be of an opposite type to that of both first epitaxial layer 142 and second epitaxial layer 144. Semiconductor pillar 162b on the right side of depicted trench 156 has no buried layer. Right side pillar 162b can be called an epitaxial pillar, as a dopant concentration is determined by the dopant concentration of epitaxial layers 142 and 144. In some embodiments, such epitaxial trenches can be used beneath bond pad locations, for example.

Such semiconductor pillars 162b as the one depicted with buried layer 176 form two metallurgical junctions, one in first epitaxial layer 142 and one in second epitaxial layer 144. These metallurgical junctions each have a depletion region in which the majority carriers are significantly depleted on either side of the metallurgical junction. In some embodiments, the net dopant concentration in buried layer 176 can be greater than the net dopant concentration in either or both of first epitaxial layer 142 and second epitaxial layer 144, for example.

No contacts 136 are depicted contacting semiconductor pillars 162b in FIG. 5B. Metallization features 132, 134 and field gates 158 can be biased to voltages that are lower than the voltage biasing substrate 140 (shown in FIG. 4). When substrate 140 is biased to a high positive voltage and metallization features 132, 134 and field gates 158 are biased to relatively low voltages with respect to the voltage biasing substrate 140, an electric field will be established in trench-MOSFET die 104. The established electric field can have a general vertical direction, from substrate 140 at a bottom of trench-MOSFET die 104 and toward a top of trench-MOSFET die 104, where such metallization features 132, 134 and field gates 158 reside. Wherever such a field exists, free charge carriers will respond accordingly, parallel and anti-parallel to the established field (e.g., for holes and electrons respectively).

One idea behind the use of trenches 154, 156 is to reduce the number of free charge carriers in the semiconductor pillars 162b between adjacent trenches 154, 156. The number of charge carriers can be reduced in various manners. Field plates 158 in adjacent and closely spaced trenches 152, 154 can be biased so as to cause significant depletion of charge carriers from intervening semiconductor pillars 162b. Creating metallurgical junctions in semiconductor pillars 162b can result in a reduction of charge carriers in the depletion regions associated with such junctions. Biasing conditions of field plates 158 and substrates 140 can make the depletion of charge carriers in semiconductor pillars 162b more favorable for one type of dopant species over the other, for example.

Because charge carriers are responsive to electric fields, free charge carriers within semiconductor pillars 162b can respond to such fields and can move along field lines. The field lines, being substantially vertically oriented in FIGS. 4-5B can result in a buildup of such free charge carriers at semiconductor/dielectric interface 152, if no contact is present, providing a mechanism for carrier removal. In some embodiments, such charge carriers may be removed by providing a conduction path for them. For example, source metallization feature 134 might be connected to semiconductor/dielectric interface 152 via a contact similar to contacts 136. In other embodiments, no such contacts may be provided, as such charge buildup may not be deemed deleterious, and in certain circumstances may be considered advantageous.

Figure 6:
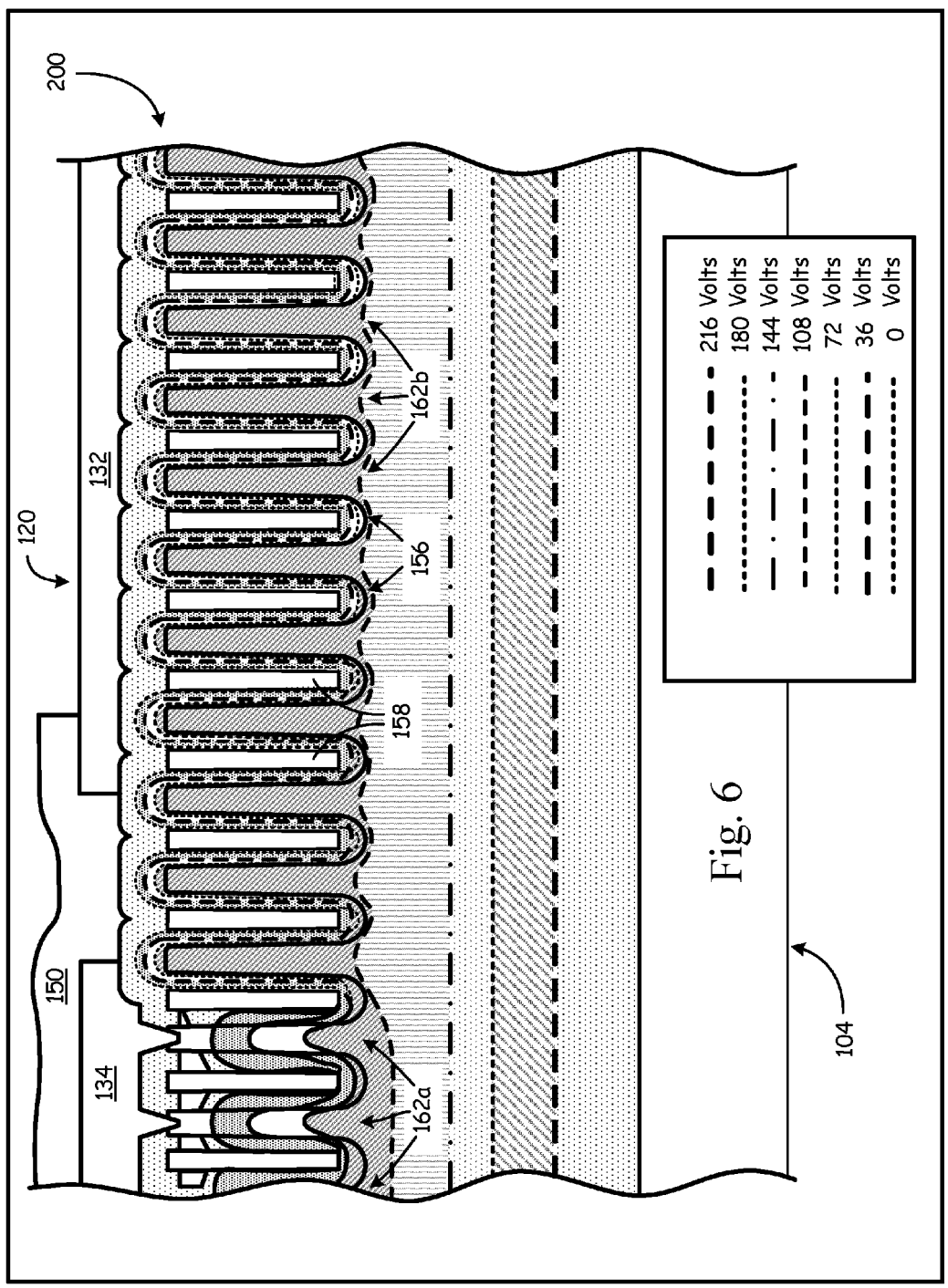
FIG. 6 is a cross-sectional side elevation view showing an electrical field pattern established beneath a bonding pad. .

FIG. 6 is a cross-sectional side elevation view showing an electrical field pattern established beneath a bonding pad. The same cross-sectional portion of trench-MOSFET die 104 depicted in FIG. 4 is shown in FIG. 6. In FIG. 6, cross section 200 includes annotation of an established electric field. In FIG. 6, metallization feature 132 might be the bonding pad 120 (shown in FIG. 1). Trenches 156 include field plates 158 that are biased so as to substantially deplete intervening semiconductor pillars 162a, 162b. The depicted equipotential lines help to visualize the established field. The drain of trench-MOSFET die 104 has been biased to 216 volts, via a backside substrate contact. Where the equi-potential lines are close to one another, the electric field is high, and where the equi-potential lines are far apart from one another, the electric field is low.

Equipotential lines are annotated as 0, 36, 72, 108, 144, 180 and 216 Volts. Note that the voltage of semiconductor pillars is low for the leftmost semiconductor pillars which are MOSFET pillars. Each of these leftmost pillars has a vertical voltage gradient from 0 volts at top surface 122 and about 100 volts at a depth location approximately equal to a depth location of the bottoms of adjacent trenches. Going to the right, the remaining semiconductor pillars are biased to about 100 volts. Each of these remaining semiconductor pillars has approximately no vertical voltage gradient therein. Thus, these pillars shield top surface 122 from the full drain bias of 216 volts.

The entire length of an individual trench 136 can be part of a MOSFET device on one or both lateral sides, if the trench includes requisite device gates 160 and sandwiching semiconductor pillars 162a contain requisite source 168, body 170, and drain 172 regions. Other individual trenches 236 might not have MOSFET transistor capabilities. Some individual trenches 236 might contain only field gates 158, for example. Such a trench 236 might be sandwiched by semiconductor pillars 162b that have no source 168, body 170, and/or drain 172 regions. Such trenches 236 might be used for the purpose of reducing the vertical voltage gradient in the epitaxial layers 142, 144.

Figure 7:
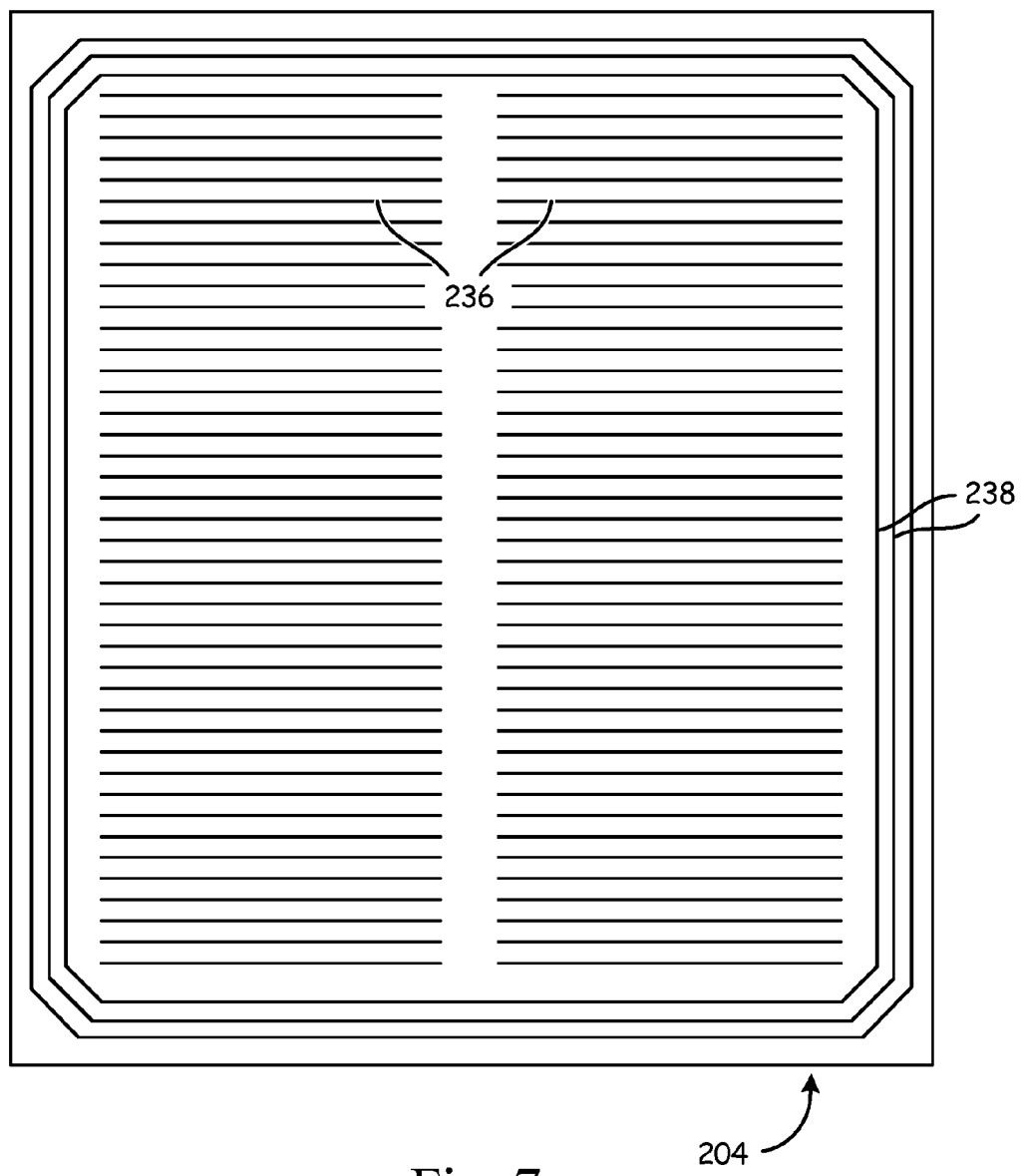
FIG. 7 is a plan view of an exemplary trench-MOSFET die showing trenches that are broken along a center line of a die.

FIG. 7 is a plan view of an exemplary trench-MOSFET die showing trenches that are broken along a center line of a die. In FIG. 7, trench-MOSFET die 204 is shown depicting trenches 236, 238 residing beneath metallization features 132, 134. The layout pattern of trenches 236, 238 depicts an alternate embodiment to that of trenches 136, 138 depicted in FIG. 3. Trenches 236 and 238 may be broken for various reasons. Metal conduction traces may be routed though the break between trenches 236 and 238, for example. A separation distance of the break between the traces can be controlled to permit trenches 236 and 238 to control a depletion of majority carriers in the semiconductor region adjacent to and between trenches 236 and 238.

Each individual trench 236 can contain device gate 160 on one or both of lateral sides of trench 236. Each of such device gates 160 can be used to control the conduction of current through an adjacent body region 170 of a MOSFET transistor. Each individual trench 236 may be sandwiched by adjacent semiconductor pillars 162a, 162b having various regions of various dopant species.

Alternatively, a portion of the length of an individual trench 236 might be part of a MOSFET device, and the remaining portion of the individual trench 236 might have not transistor capability. Such a trench might extend beneath a bonding pad, for example. Beneath the bonding pad, the trenches might have no transistor capability, for example. For portions of the trench 236 that extend beyond some lateral distance away from the edge of the bonding pad, trench 236 can acquire transistor capability. The act of wire bonding can be potentially damaging to active circuitry in the vicinity of the actual wire bond. Therefore removing such active circuitry to a distance away from the bonding pad can improve yield and/or reliability, for example. It also might be advantageous to retain the field plates below the bonding pads, so as to reduce the maximum fields between the bonding pad and semiconductor/dielectric interface below.

Figure 8A:
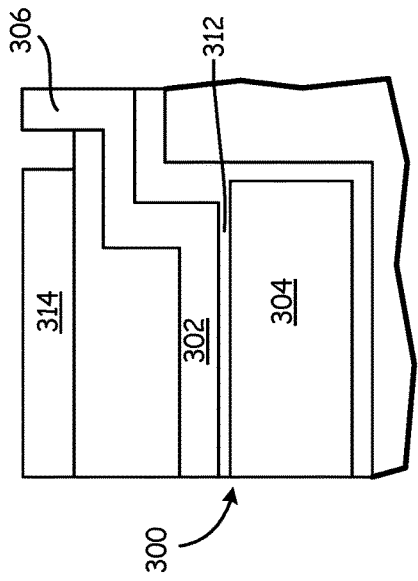
FIGS. 8A-8D are cross-sectional views of an exemplary trench-based semiconductor device having a bonding pad over trenches.

FIGS. 8A-8D are cross-sectional views of an exemplary trench-based semiconductor device having a bonding pad over trenches. In FIG. 8A, a cross-sectional portion of a two trenches 300 is sectioned in a plane perpendicular to a longitudinal trench direction. Trenches 300 include gate poly 302 and field poly 304. Gate poly 302 is biased by interconnection net 306, which is in electrical communication with a gate pad. Gate poly 302 provides field channels 308 adjacent to dielectric sidewalls 310 of trenches 300. In the depicted cross-section, field poly 304 is shown isolated from connection with an interconnection net. Connection of field poly 304 to an interconnection net can be made at a longitudinal location not depicted in the cross-sectional location of FIG. 8A (e.g., either in a longitudinal location into or out of the paper). In some embodiments, field poly 304 can be biased via a connection to a source biased interconnection net.

Figure 8B:
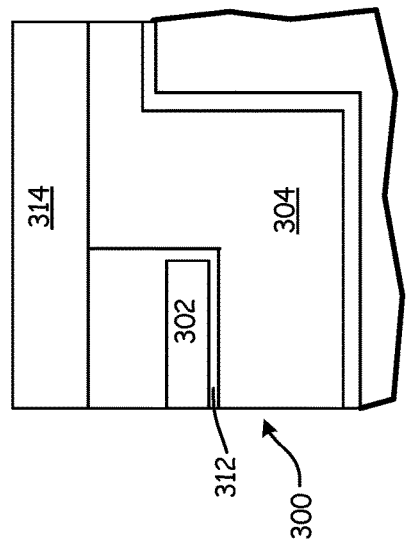

In FIG. 8B, a cross-sectional portion of one of trenches 300 is sectioned in a plane perpendicular to a lateral trench direction. Trench 300 includes gate poly 302 and field poly 304. Gate poly 302 is biased by interconnection net 306, which is in electrical communication with a gate pad. Gate poly 302 is electrically isolated from field poly 304 via interpolate dielectric material 312. Trench 300 is located below source biased interconnection net 314.

Figure 8C:
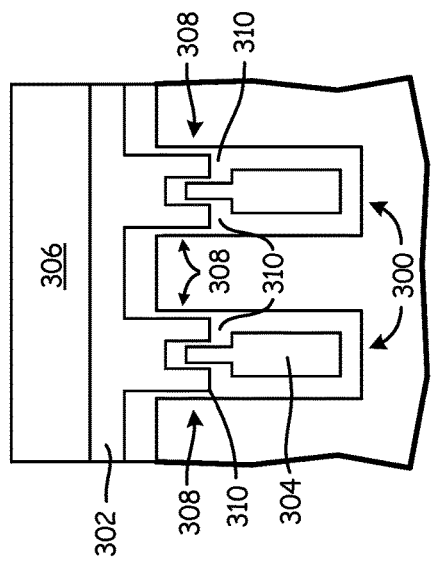

In FIG. 8C, a cross-sectional portion of two trenches 300 is sectioned in a plane perpendicular to a longitudinal trench direction but at a different longitudinal location than the cross section depicted in FIG. 8A. Trenches 300 include field poly 304, section through no gate poly at the depicted cross-sectional location. In the depicted cross-section, field poly 304 is shown electrically connected to interconnection net 314.

Figure 8D:
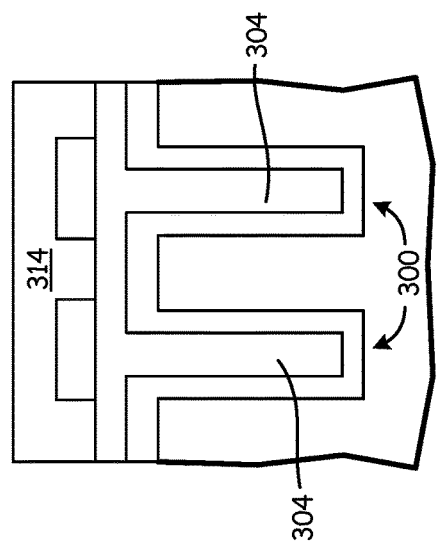

In FIG. 8D, a cross-sectional portion of one of trenches 300 is sectioned in a plane perpendicular to a lateral trench direction but at a different longitudinal location than the cross section depicted in FIG. 8B. Trench 300 includes gate poly 302 and field poly 304. Field poly 302 is biased by interconnection net 314, which is in electrical communication with a source pad. Gate poly 302 is electrically isolated from field poly 304 via interpolate dielectric material 312.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A bonding pad structure for a trench-based semiconductor device comprising:
   a plurality of trenches vertically extending from a top surface of a semiconductor, wherein each of the plurality of trenches has dielectric sidewalls and a dielectric bottom, the dielectric sidewalls and dielectric bottom electrically isolating a conductive core within each of the trenches from a region of the semiconductor outside of and adjacent to each of the plurality of trenches, the region of the semiconductor outside of and adjacent to each of the plurality of trenches biased via a contact on a bottom surface of the semiconductor;
   a metal bonding pad disposed above the plurality of trenches, the metal bonding pad electrically isolated from the region of the semiconductor outside of and adjacent to each of the plurality of trenches; and
   a layer of interconnect metal disposed above the plurality of trenches in a region outside of the metal bonding pad, the layer of interconnect metal contacting each of the plurality of conductive cores so as to provide a voltage bias to each of the plurality of the conductive cores.

2. The bonding pad structure of claim 1, further comprising:
   a dielectric material disposed between the metal bonding pad and the conductive cores of each of the plurality of trenches.

3. The bonding pad structure of claim 1, wherein the dielectric sidewalls and the dielectric bottom of each of the plurality of trenches comprise silicon-dioxide.

4. The bonding pad structure of claim 1, wherein each of the conductive cores comprises polysilicon.

5. The bonding pad structure of claim 1, wherein the plurality of trenches is arranged in a regular array beneath the metal bonding pad.

6. The bonding pad structure of claim 1, wherein the trench-based semiconductor device is a trench IGBT.

7. The bonding pad structure of claim 1, wherein the trench-based semiconductor device is a trench MOSFET.

8. The bonding pad structure of claim 7, wherein each of the plurality of conductive cores is electrically connected to a source of the trench MOSFET.

9. The bonding pad structure of claim 7, wherein the metal bonding pad is electrically connected to the gate of the trench MOSFET.

10. The bonding pad structure of claim 1, wherein each of the plurality of trenches is a longitudinal trench having a longitudinal dimension measured from a first longitudinal sidewall to a second longitudinal sidewall that is at least four times greater than a lateral dimension measured from a first lateral sidewall to a second lateral sidewall.

11. The bonding pad structure of claim 10, wherein each of the plurality of trenches longitudinally extends from a first region outside of the metal bonding pad, underneath the metal bonding pad, and to a second region outside of the metal bonding pad.

12. The bonding pad structure of claim 10, wherein each of the plurality of trenches is separated from an adjacent one of the plurality of trenches by a common separation distance.

13. The bonding pad structure of claim 10, wherein a ratio of the lateral dimension of the trenches to a lateral pitch between adjacent trenches is between 0.4 and 0.6.

14. A method of manufacturing a semiconductor device having a bonding pad structure of claim 1, the method comprising:
   etching a plurality of trenches into a semiconductor, each of the plurality of trenches extending from a top surface of the semiconductor, each of the plurality of trenches having sidewalls and a bottom;
   lining the sidewalls and the bottom of each of the plurality of trenches with a first dielectric material, the dielectric material isolating an interior cavity from the semiconductor;
   depositing a conductive material into each of the interior cavity of each of the plurality of trenches;
   providing a second dielectric material within the interior cavity of each of the plurality of trenches;
   etching the second dielectric material to expose the conductive material;

depositing a first layer of metal that electrically contacts the conductive material within each of the cavities;

patterning the first layer metal into a plurality of interconnection nets; and disposing a bonding pad above a portion of the plurality of trenches, wherein the bonding pad is electrically isolated from both a drain-biased region of semiconductor outside of the trenches and conductive material within the portion of the plurality of trenches.

15. The method of claim 14, further comprising:

forming gates within a portion of the trenches not underneath the bonding pad.

16. A bonding pad structure for a trench MOSFET comprising:

a semiconductor having a bonding pad region and a region surrounding the bonding pad region;

a plurality of longitudinal trenches, each longitudinal trench having a longitudinal dimension and a lateral dimension, the longitudinal dimension measured from a first longitudinal sidewall to a second longitudinal sidewall, the lateral dimension measured from a first lateral sidewall to a second lateral sidewall, each longitudinal trench vertically extending from a top surface of the semiconductor to a trench bottom, wherein the lateral sidewalls and the trench bottom of each of the plurality of longitudinal trenches have a dielectric layer isolating a conductive core within each of the longitudinal trenches from a drain-biased region of semiconductor outside of and adjacent to the longitudinal trenches;

a layer of interconnect metal disposed above the plurality of longitudinal trenches in the region surrounding the bonding pad region, the layer of interconnect metal contacting each of the plurality of conductive cores; and a metal bonding pad disposed above the plurality of longitudinal trenches, the metal bonding pad electrically isolated from the layer of interconnect metal and electrically isolated from the drain-biased region of semiconductor outside of and adjacent to the longitudinal trenches.

17. The bonding pad structure of claim 16, further comprising:

a dielectric material disposed between the metal bonding pad and the conductive cores in the bonding pad region.

18. The bonding pad structure of claim 16, wherein the conductive core comprises polysilicon.

19. The bonding pad structure of claim 16, wherein the dielectric layer comprise silicon-dioxide.

20. The bonding pad structure of claim 16, wherein each of the plurality of conductive cores is electrically connected to a source of the trench MOSFET.

21. The bonding pad structure of claim 16, wherein the metal bonding pad is electrically connected to the gate of the trench MOSFET.

* * * * *